United States Patent
Sandhu et al.

(10) Patent No.: US 6,541,809 B1
(45) Date of Patent: Apr. 1, 2003

(54) METHOD OF MAKING STRAIGHT WALL CONTAINERS AND THE RESULTANT CONTAINERS

(75) Inventors: Gurtej S. Sandhu, Boise, ID (US); Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/662,314

(22) Filed: Sep. 14, 2000

Related U.S. Application Data

(62) Division of application No. 09/200,153, filed on Nov. 25, 1998, now Pat. No. 6,235,639.

(51) Int. Cl.[7] ..................... H01L 27/108; H01L 29/76; H01L 23/58
(52) U.S. Cl. ..................... 257/296; 257/303; 257/306; 257/635; 257/655
(58) Field of Search ................... 257/296, 301, 257/325, 655, 635, 644, 650, 657, 303, 306; 438/240, 244, 256, 239

(56) References Cited

U.S. PATENT DOCUMENTS

| | | | | | |
|---|---|---|---|---|---|
| 3,632,433 A | * | 1/1972 | Tokuyama | .................. | 438/615 |
| 4,872,947 A | * | 10/1989 | Wang et al. | ................. | 156/643 |
| 5,094,900 A | * | 3/1992 | Langley | | |
| 5,162,248 A | * | 11/1992 | Dennison et al. | ........... | 438/396 |
| 5,389,581 A | * | 2/1995 | Freiberger et al. | .......... | 438/622 |
| 5,424,570 A | * | 6/1995 | Sardella et al. | ............. | 257/333 |
| 5,598,028 A | * | 1/1997 | Losavio et al. | ............. | 257/644 |
| 5,633,208 A | * | 5/1997 | Ishikawa | ..................... | 438/699 |
| 5,674,356 A | * | 10/1997 | Nagayama | | |
| 5,705,838 A | * | 1/1998 | Jost et al. | ...................... | 25/296 |
| 5,716,884 A | * | 2/1998 | Hsue et al. | ................. | 438/254 |
| 5,763,286 A | * | 6/1998 | Figura et al. | | |
| 5,849,635 A | * | 12/1998 | Akram et al. | | |
| 5,943,582 A | * | 8/1999 | Huang et al. | ............... | 438/396 |
| 6,015,735 A | * | 1/2000 | Shue et al. | ................. | 438/254 |
| 6,180,997 B1 | * | 1/2001 | Lin | ........................... | 257/637 |

FOREIGN PATENT DOCUMENTS

| | | | |
|---|---|---|---|
| EP | 0 469 214 A1 | * | 2/1992 |
| EP | 0 534 130 A1 | * | 3/1993 |

* cited by examiner

*Primary Examiner*—Matthew Smith
*Assistant Examiner*—Lex H. Malsawma
(74) *Attorney, Agent, or Firm*—Dickstein Shapiro Morin & Oshinsky LLP

(57) ABSTRACT

A method for providing semiconductor openings having a substantially straight wall or other desired etch profile. An etchable material layer is formed having target dopant levels or other etch rate varying characteristics to compensate for the characteristics of a selected etching process to achieve the desired etch profile. The etching process may also be varied to further match the characteristics of the etchable material layer.

17 Claims, 9 Drawing Sheets

METHOD OF MAKING STRAIGHT WALL CONTAINERS AND THE RESULTANT CONTAINERS

This application is a divisional of application Ser. No. 09/200,153, filed on Nov. 25, 1998, now U.S. Pat. No. 6,235,639, which is hereby incorporated in its entirety by reference.

FIELD OF THE INVENTION

The present invention relates to the fabrication of integrated circuit devices, and more particularly, to a semiconductor method of forming container cells, vias and other openings having a specifically desired etch profile.

BACKGROUND OF THE INVENTION

The method for forming a target etch profile according to the present invention has special applicability to the formation of container cells for semiconductor capacitors but is not limited thereto. Capacitors in the form of container cells are used in a wide variety of semiconductor circuits. Capacitors are of special importance in DRAM (dynamic random access memory) memory circuits; therefore, the invention will be particularly discussed in connection with DRAM memory circuits. However, the invention has broader applicability and is not limited to DRAM memory circuits. It may be used in other types of memory circuits, such as SRAMs, as well as any other integrated circuit in which capacitors are used, or in which maximizing the volume of etched cells within a given cell area is desired, or in which there is a need for a semiconductor via or other cavity having a target etch profile.

Known container capacitors are in the shape of an upstanding tube (cylinder) with an oval or circular cross section. The wall of the tube consists of two plates of conductive material such as doped polycrystalline silicon (referred to herein as polysilicon or poly) separated by a dielectric. The bottom end of the tube is closed, with the outer wall in contact with either the drain of the access transistor or a plug which itself is in contact with the drain. The other end of the tube is open. The sidewall and closed end of the tube form a container; hence the name "container capacitor."

FIG. 2 illustrates a step in the formation of a container capacitor in which the container cell area 144 is prepared for the deposition and etching of an Interlevel Dielectric Material (IDM). Following the deposition and etching of the IDM layer, a conductive layer is then deposited within the container cell. The surface area of this conductive material determines the capacitance of the capacitor and is dependent on the volume of the container cell. The volume of the container cell in turn is dependent upon the successful etching of the IDM layer.

In constructing a container cell, the IDM layer is typically composed of borophosphosilicate glass (BPSG); phosphosilicate glass (PSG), silicon dioxide, or the like. When the etchant is applied, the amount of etching performed is dependent upon the etch rate and the length of time the etchant is applied. The direction of the etch is determined by the degree to which the selected etching process is isotropic or anisotropic. Etching which proceeds in all directions at the same rate is said to be "isotropic". By definition, any etching that is not isotropic is anisotropic. Wet etching, for example, is isotropic. Many etching processes typically fall between the extremes of being isotropic and completely anisotropic and, therefore, some unwanted etching is common even under the best conditions of prior etching processes.

Ideally, the process used to etch the IDM layer would be completely anisotropic, as this would produce a completely vertical container wall. However, as the etching of the IDM layer occurs at least somewhat isotropically, some unwanted etching in the horizontal direction occurs. In other words, as etching processes are applied for a length of time to etch in a downward direction for a required depth, etching also occurs in an outward direction. This typically causes a widening or bowing out at the top of the etched container cell. The isotropic component of the etch process is a function of the etch conditions, the etch rate, and the characteristics of the material being etched.

As illustrated in FIG. 1a, the resulting shape of the container cell is one in which the sidewalls 150 are sloped and hence the volume of the container is not maximized. This results in less room for conductive material and lower capacitance for the container capacitor. FIG. 1b illustrates an ideal container cell in which the side walls 152 are vertical and hence the container volume is maximized.

FIG. 1c illustrates an overlapping comparison of the sloping wall 150 container versus the straight wall 152 container. The lost volume 160 caused by the sloping of the walls decreases the surface area of the container capacitor and thus the capacitance of the resulting capacitor.

As memory cell density continues to increase, efficient use of space becomes ever more important. Therefore, what is needed is an etching process and container capacitor that make more efficient use of available memory cell space.

Further, as the trend of scaling down and the need for fabricating extremely precise submicron components continue, it is becoming increasingly important to provide techniques for fabricating substantially straight vertical sidewalls and various other precise target etch profiles.

SUMMARY OF THE INVENTION

The present invention provides a method of compensating for the unwanted etch characteristics of any desired etching process in order to achieve precise, submicron target etch profiles.

The present invention also provides a method and resultant structure which increases the capacitance of container capacitors without increasing their stack height.

An etching process may be made "selective" to one surface over another based upon a variety of characteristics of the material being etched. These characteristics are termed "etch rate varying characteristics" and include, but are not limited to, dopant levels, density, deposition temperature, and deposition pressure. By making an etching process or etchant "selective" to a particular surface or composition, the process or etchant will etch that particular surface or composition less rapidly than the surrounding surface or other material with which the etchant may come into contact. Accordingly, where an etchant is selective for a heavily doped material such as heavily boron doped BPSG, the etchant will etch layers of material containing heavily boron doped BPSG less quickly than other layers not similarly composed.

According to one aspect of the present invention, a two step etch is applied to a layer of material having an upper composition and a lower composition. To this layer of material, a first etch process is applied which is selective for the lower composition such that it keeps a relatively more vertical profile in the upper composition and slows down when it reaches the lower composition. A second etch process is then applied which has a high selectivity to the upper composition, so that it will etch the upper composition relatively less rapidly and thus have a low isotropic component for the upper composition. The second etch process also preferably has sufficient selectivity to the layer beneath the lower composition (usually nitride) so as not to damage the underlying layer.

In this two step etch embodiment, the selectivities of the etch for the upper and lower compositions may be varied by changing the etch process itself, or by varying the compositions of the upper and lower layers, or by a combination of both of these factors. According to a preferred 2-layer embodiment of the present invention, the upper IDM layer is a lightly doped BPSG or phosphosilicate glass (PSG) layer and the lower IDM layer is a highly doped BPSG or phosphosilicate glass (PSG) layer.

According to another preferred embodiment, the upper layer is high density plasma phosphosilicate glass (HDP PSG) with low dopant levels and is deposited at high temperature, and the lower layer is HDP PSG with high dopant levels and is deposited at low temperature.

According to another aspect of the invention, a single IDM layer having graded, target dopant levels is used in conjunction with a two step etching process. In accordance with this aspect of the invention, the first etch is selective to the lower composition of the IDM layer. The second etch is selective to the upper composition of the IDM layer and thus has a low isotropic component for etching the upper composition. According to a preferred embodiment, the IDM layer as initially deposited is doped with 1% boron and 2% phosphorous, and these dopant levels are increased in a continuous manner to 4% boron, 7% phosphorous as the IDM layer is deposited.

In yet another aspect, a wet etch solution is applied after the container hole or other feature is etched with a dry etch process. The purpose of the wet etch is to alter, for example, straighten out, the container sidewall after the dry etch. The dopant profile is adjusted so as to result in a maximum wet etch rate at the location where the container diameter after the dry etch is the smallest in order to produce substantially straight container sidewalls.

These preferred embodiments result in an etch profile having substantially straight vertical sidewalls. By use of the term "substantially straight" herein we mean that a sidewall does not vary outside the range of plus or minus one degree of arc for any 1 micron segment of elevation of the sidewall, and more preferably does not deviate by a dimension of greater than 5% of the average width of the opening at any point along the sidewall.

By use of the term "target" dopant levels herein we mean that the dopant concentration is intentionally varied to achieve an etch characteristic which provides the desired etch profile. The etch profile may be a substantially straight vertical profile, or any other target profile that may be desired for a given application, including, for example, convex sidewalls, concave sidewalls, inward sloping or outward sloping sidewalls, and combinations of these or various other profiles at different levels of the etched opening, including for example, an hour-glass or a multiple stepped profile. The target profile may also have continuous curves, if desired, or abrupt edges, or a combination of both.

In addition, the target dopant levels or other etch rate varying characteristics may be continuously graded target dopant levels, or other continuously graded etch rate varying characteristics, so long as the target dopant level, etc., is matched to the etching process to achieve a target etch profile, as will be described in detail below.

Additional objects and advantages of the invention will be set forth in part in the description which follows, and in part will be obvious from the description, or may be learned by the practice of the invention. The objects and advantages of the invention will be attained by means of instrumentalities and combinations particularly pointed out in the appended claims.

DETAILED DESCRIPTION OF PREFERRED EMBODIMENTS

Reference will now be made in detail to the presently preferred embodiments of the invention, which together with the accompanying drawings, serve to explain the principles of the invention.

An exemplary fabrication process for a container capacitor according to one embodiment of the present invention is described below. It is to be understood, however, that the invention is applicable in all areas of semiconductor fabrication where openings are formed such as in the creation of polysilicon plugs, bit line contacts and various other structures, where a substantially straight vertical or other target etch profile is desired. Further, the invention is applicable to etching container structures for planar capacitors as well as other forms of stacked capacitors such as trench capacitors.

Additionally, the invention is discussed primarily with reference to etching container cells from IDM layers comprised of doped borophosphosilicate glass (BPSG) and phosphosilicate glass (PSG). It should be understood, however, that many other materials may be used. For example, any etchable materials, such as polysilicon, silicon nitride, silicon dioxide, aluminum, and tungston may be used in the method of the invention. Various cell dielectric materials such as barium strontium titanate $(Ba,Sr)TiO_3$ ("BST"), or protective materials such as silicon nitride $SiN_4$, may also be etched. The invention is not intended to be limited by the specific, preferred structure, materials, or process steps described below.

Figure 1A:
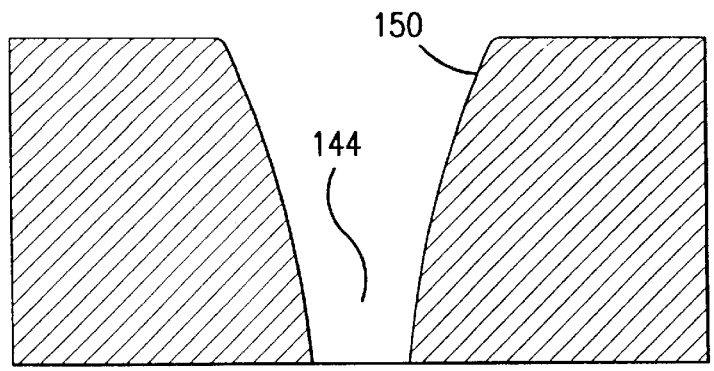
FIG. 1a is a cross-sectional view of a container cell illustrating the problem of bowing out during an etch.
Figure 1B:
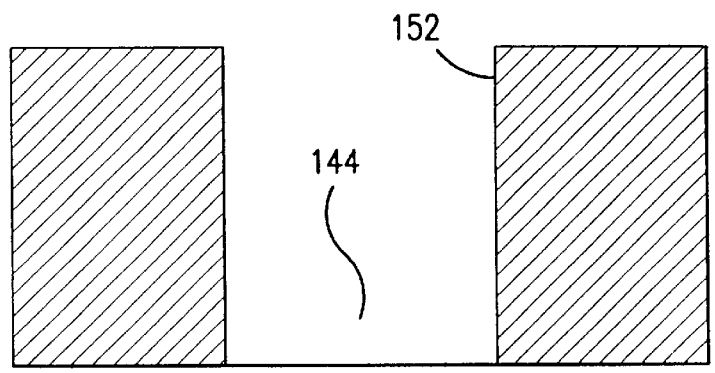
FIG. 1b is a cross-sectional view of a container cell which has undergone a substantially straight vertical etch.
Figure 1C:
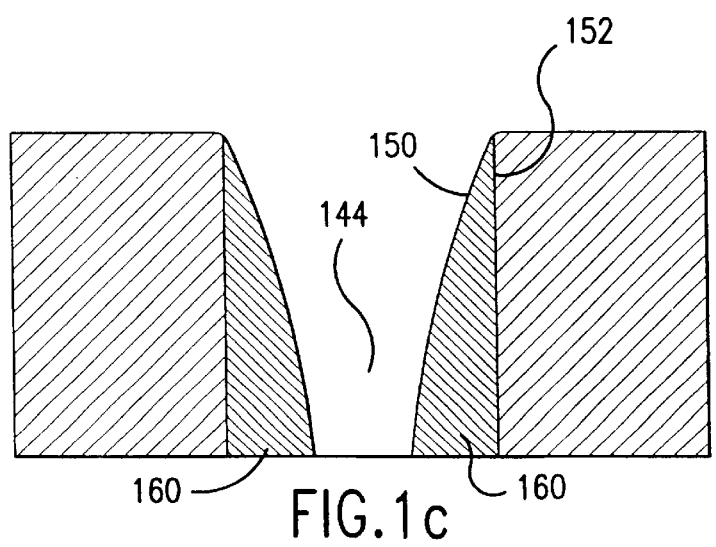
FIG. 1c is a cross-sectional view of a container cell illustrating the problem of bowing out and the diminished volume due to horizontal etching.
Figure 2:
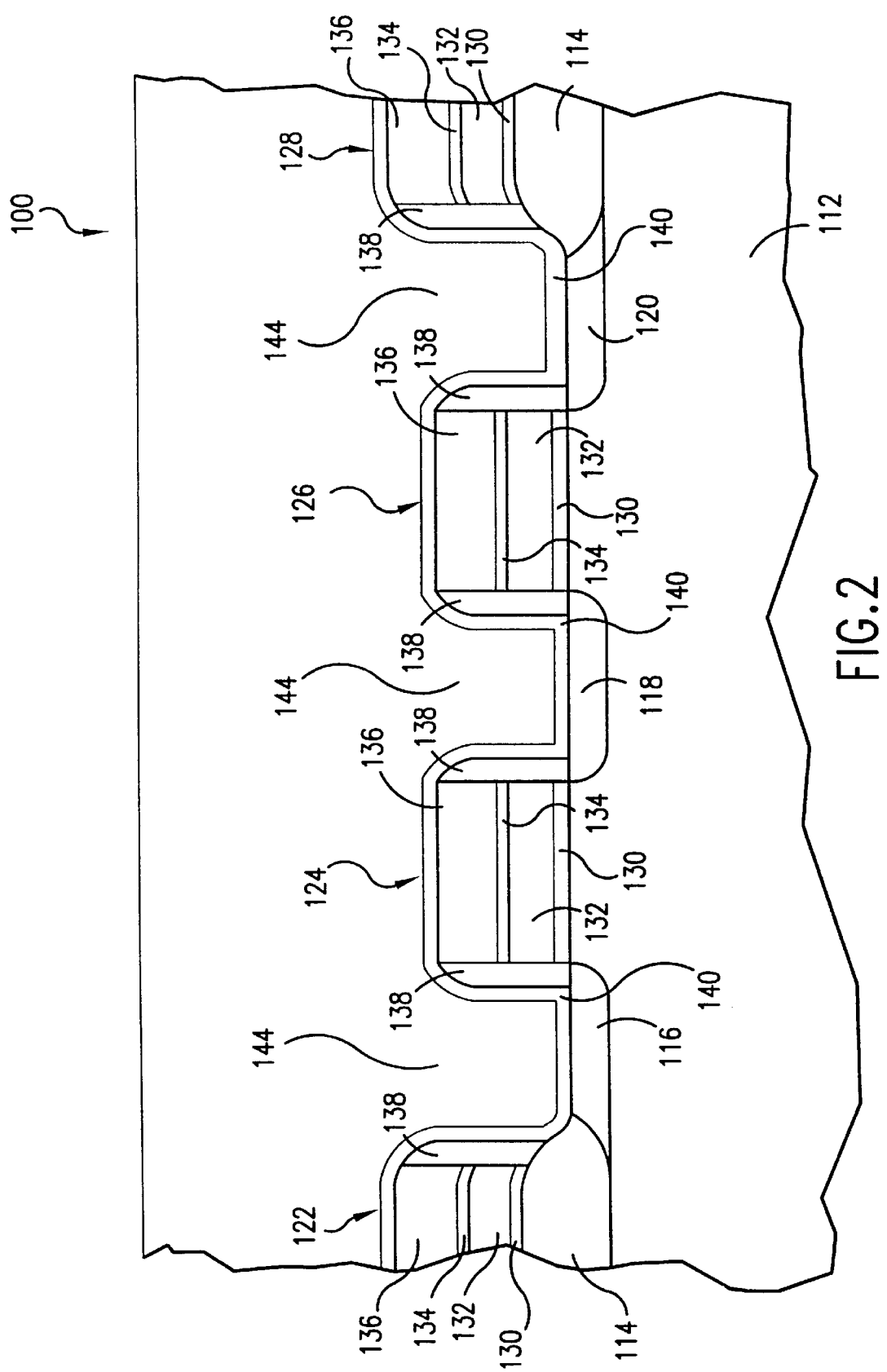
FIG. 2 is a cross-sectional view of a partially completed integrated circuit.

Referring now to FIG. 2, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Three cell containers 144 and two FETs are depicted in FIG. 2. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed. A thin layer 140 of nitride is then provided atop the wafer 100.

Figure 3:
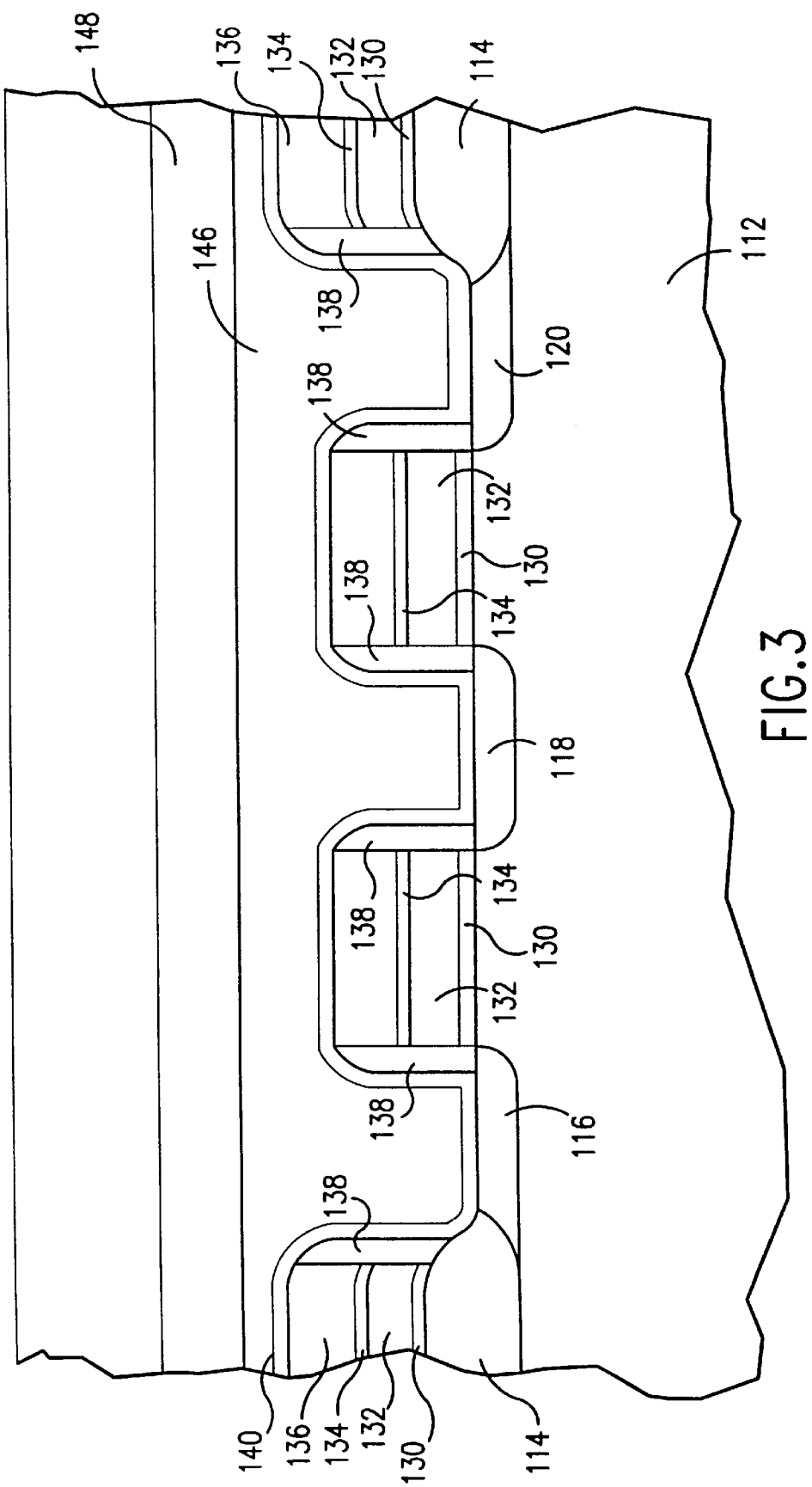
FIG. 3 is a cross-sectional view of a partially completed integrated circuit in which a dual IDM layer has been deposited.

According to a first aspect of the present invention, dual IDM layers are then deposited into the container cells 140 and over the word lines 122, 124, 126, 128. As illustrated in FIG. 3, the dual IDM layers include an initially deposited lower layer 146 and a subsequently deposited upper layer 148. Each of the upper and lower IDM layers has a different etch rate from the other when etched according to the two step etch process detailed below. The etch rates of the dual IDM layers are controlled by adjusting selected target etch rate varying characteristics of the IDM layers such as target dopant level, deposition temperature, deposition pressure and density. Each etch rate varying characteristic can be adjusted individually or in conjunction with other etch rate varying characteristics or etch processes in order to achieve the desired etch rate and degree of isotropy in each of the dual IDM layers.

According to a preferred embodiment of the present invention, the target dopant levels of the upper and lower IDM layers are adjusted so that the lower layer 146 is a layer of relatively highly doped BPSG, and the upper layer 148 is a layer of relatively lightly doped BPSG.

In an alternative preferred embodiment, the target dopant levels of the upper and lower IDM layers are adjusted so that the lower layer 146 is a layer of lightly doped BPSG or phosphosilicate glass (PSG), and the upper layer is a layer of highly doped TEOS (tetraethyl orthosilicate). Additionally, numerous other combinations of upper 148 and lower 146 IDM layers may be used so long as the upper 148 and lower 146 IDM layers are distinct in their compositions and resultant etch rates.

A method of forming dual composition IDM layers in accordance with the preferred embodiment of the invention will now be described. In the preferred embodiment of the present invention, the upper and lower IDM layers of doped BPSG are provided in situ by means of Thermal Chemical Vapor Deposition ("TCVD"). Other depositional methods may also be used such as Rapid Thermal Processing Chemical Vapor Deposition ("RTPCVD"), Low Pressure Chemical Vapor Deposition ("LPCVD") or Molecular Beam Epitaxy ("MBE"). Additionally, the IDM layers may be doped using doping techniques such as diffusion doping and ion implantation.

Applying the principles of TCVD, the target dopant levels of the IDM layers are controlled by the introduction of gaseous sources of, e.g., phosphorus or boron, along with the silicon and oxygen containing sources normally required to form a silicon oxide layer. Examples of phosphorus containing sources include triethylphosphate (TEPO), triethylphosphite (TEP), trimethylphosphate (TMOP), trimethylphosphite (TMP), and similar compounds. Examples of boron containing sources include triethylborate (TEB), trimethylborate (TMB), and similar compounds. Once vaporized, the dopants are then mixed with a helium carrier gas and an oxygen mixture, preferably with about 10% ozone gas, and then passed over the IDM layer to be doped.

According to the preferred embodiment, formation of the doped BPSG IDM layers is performed using a temperature within the range of about 400° C. to about 700° C., a pressure within the range of about 10–760 torr, and a TEOS flow of about 400 to 1000 milligrams per minute (mg/min). In this preferred version, TEPO is preferably introduced at a rate of between about 50–200 mg/min; TEB is preferably introduced at a rate of between about 50–200 mg/min; the helium carrier gas is preferably introduced into the gas mixing system at a flow rate of about 5000 standard cubic centimeters per minute (sccm); and the flow rate of the oxygen gas is about 5000 sccm. Within the preferred ranges, the amounts of TEPO and TEB are then adjusted to produce the target dopant levels and compositions for each IDM layer.

Following the deposition and target doping of the IDM layers, a multiple step etching process is applied to remove the IDM material from the container cell area 144. A variety of dry etching techniques such as plasma etching and reactive ion etching are preferably used for this purpose. According to a particularly preferred embodiment of the present invention, a high density (at least $10^{11}$ ions/cm$^3$) plasma etch is used with a source power (power applied to the plasma source) of between 500 and 1000 Watts and a bias power (power applied to the substrate) of between 500 and 1000 Watts. The preferred pressure for this high density plasma etch is about 2 millitorr using 50 sccm of a gas such as $CHF_3$, $C_2HF_5$, and $CH_2F_2$. The selectivity of the high density plasma etch is adjusted by changing the bias power. By matching and adjusting the high density plasma etch to the specific target dopant level of the layer being etched, a substantially straight vertical etch is achieved as detailed below.

Figure 4:
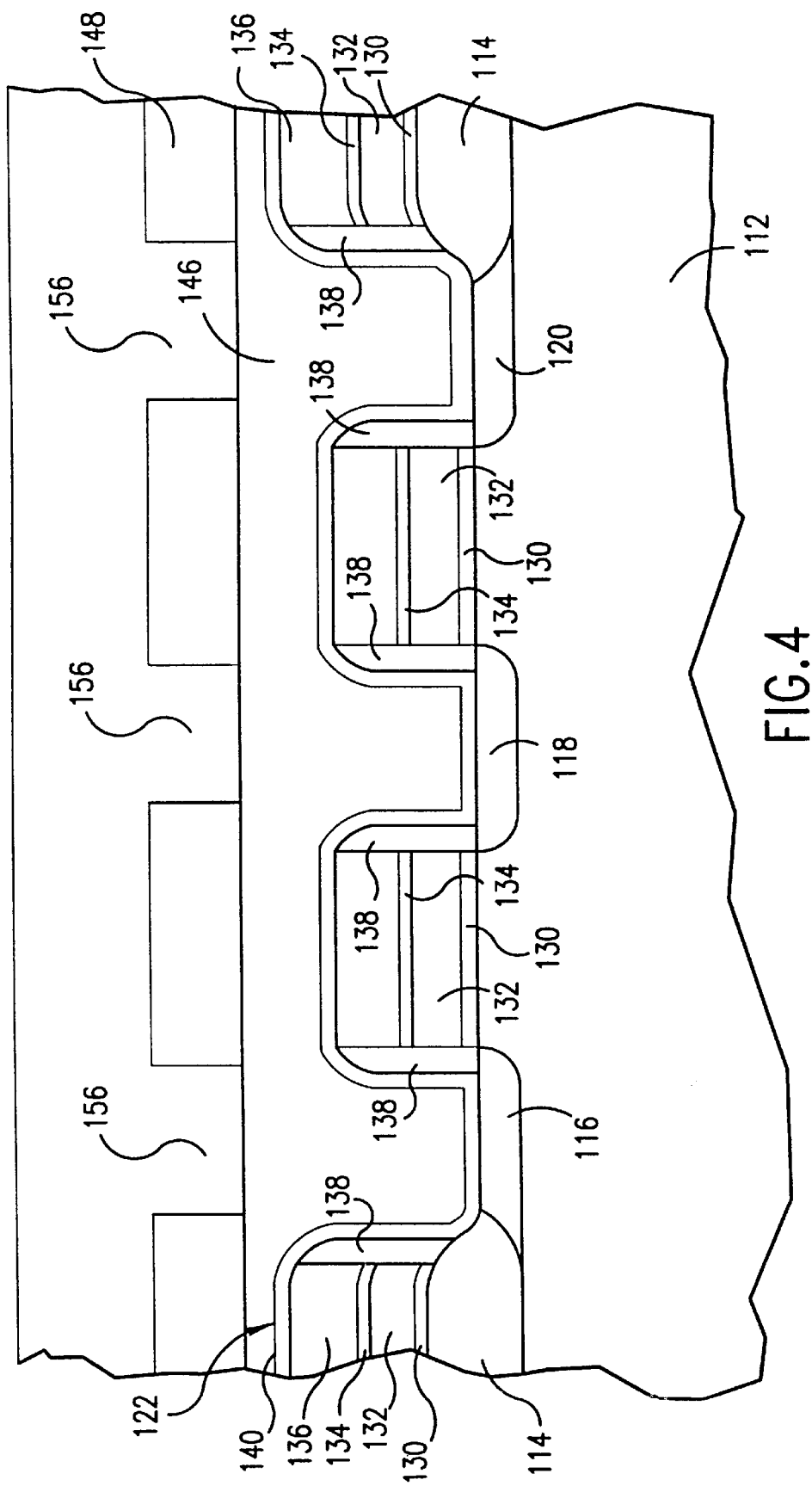
FIG. 4 is a cross-sectional view of a partially completed integrated circuit in which the upper layer of the dual IDM layer has been etched during the first step of the etching process.

The etching process of the invention is preferably conducted in two or more steps. During the first etching step, a first etch process is applied which is selective for the composition of the lower IDM layer 146 such that it keeps a substantially straight vertical profile in the upper composition and slows down when it reaches the lower composition. As illustrated in FIG. 4, at the conclusion of the first etching step, the upper IDM layer 148 is etched through and the initial container openings 156 are formed.

Figure 5:
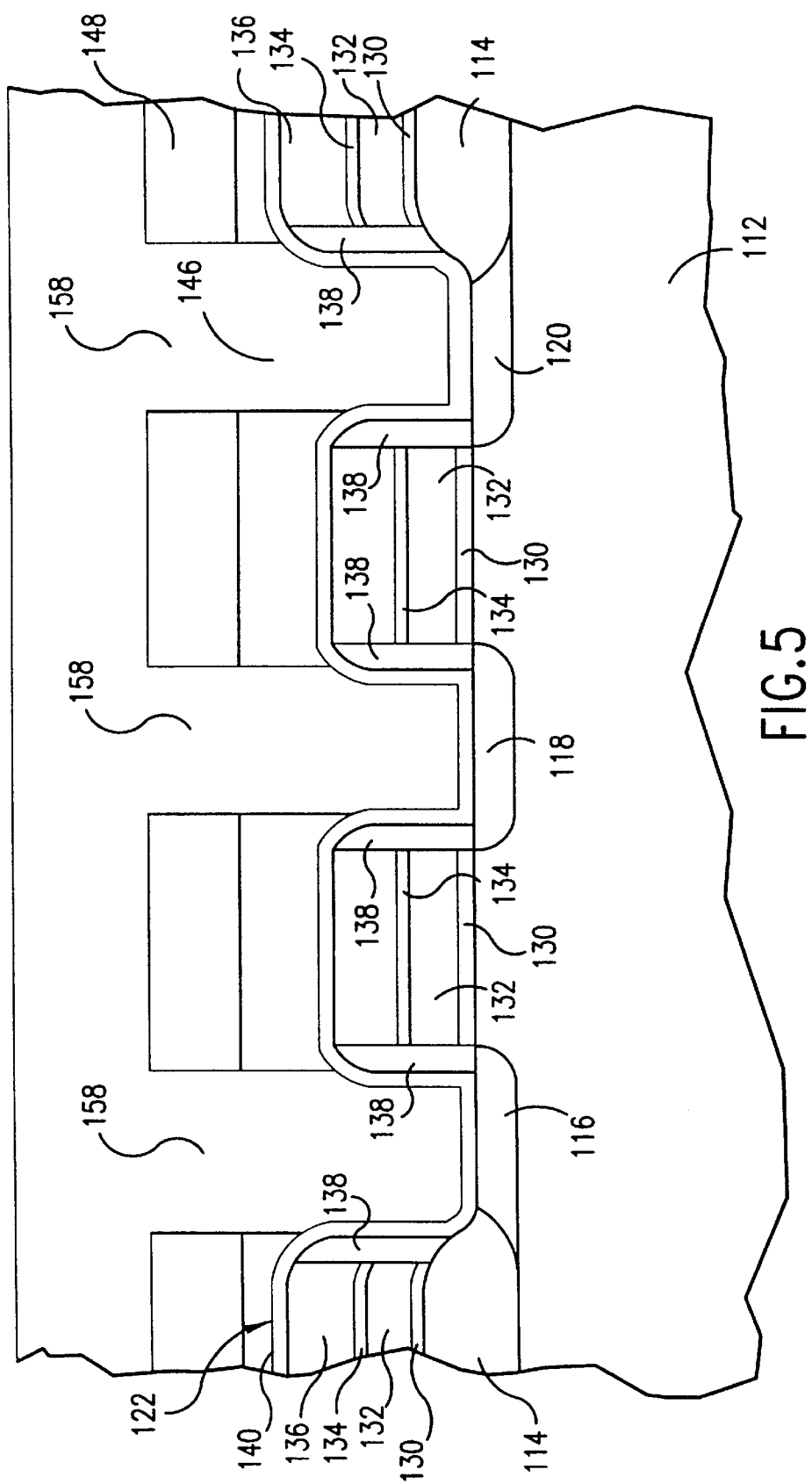
FIG. 5 is a cross-sectional view of a partially completed integrated circuit in which the upper and lower layers of the dual IDM layer have been etched.
Figure 9:
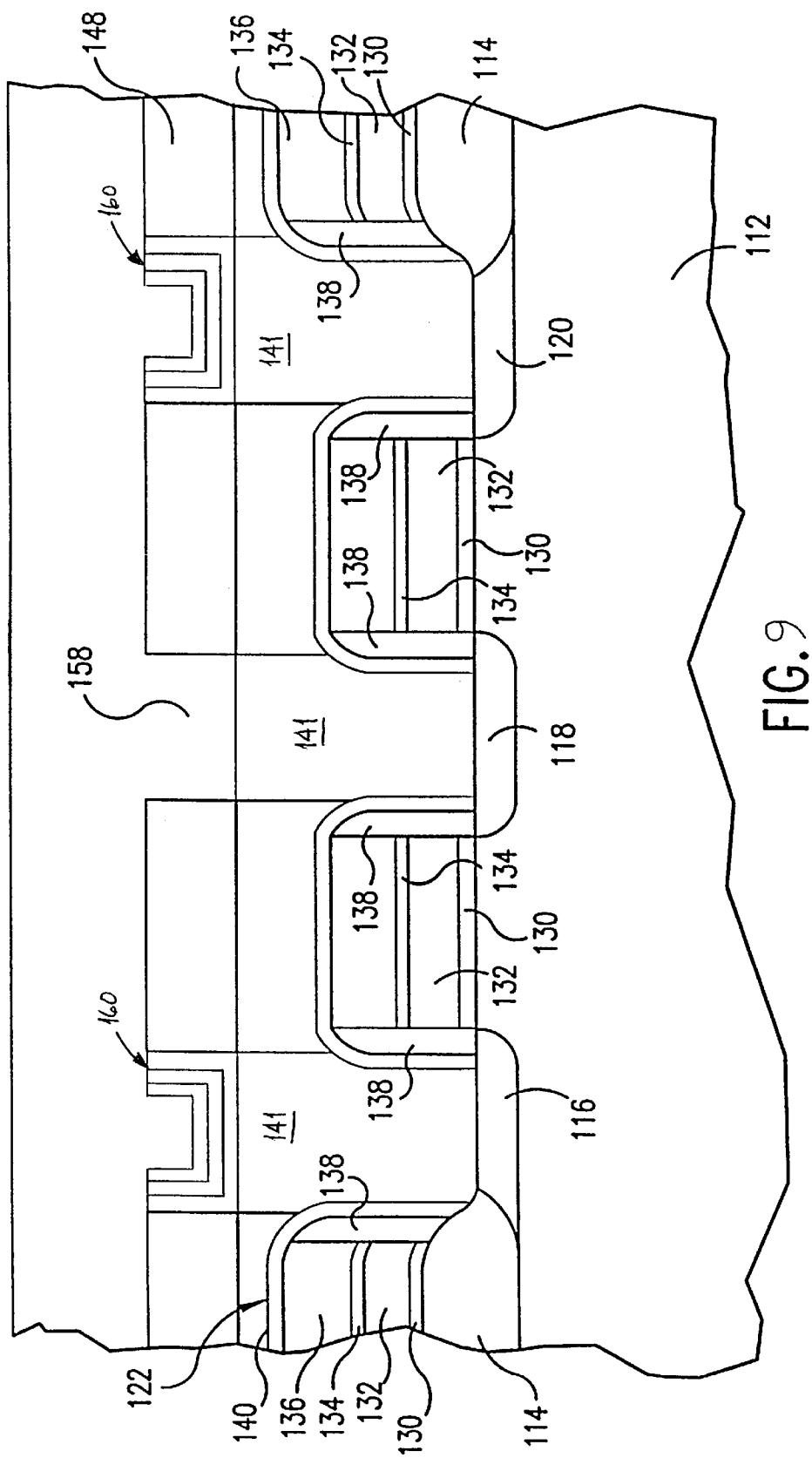
FIG. 9 is a cross-sectional view of a capacitor constructed in accordance with an embodiment of the invention.

Once the first etching step is completed, a second etch is conducted which has a high selectivity to the upper IDM layer 148, and thus a very low isotropic component for the upper IDM layer 148. This second etch also has sufficient selectivity to the thin nitride layer 140. As illustrated in FIG. 5, at the conclusion of the second etching step, the lower IDM layer 146 is etched through and the completed container openings 158 are formed. As shown in FIG. 9, a capacitor 160 is illustrated in a completed container opening 158. The thin layer 140 is removed from the well of the opening 158 via methods well-known in the industry (See U.S. Pat. No. 5,705,838), and then a plug 141 is deposited within the opening 158, followed by the deposition of the capacitor 160.

Figure 6:
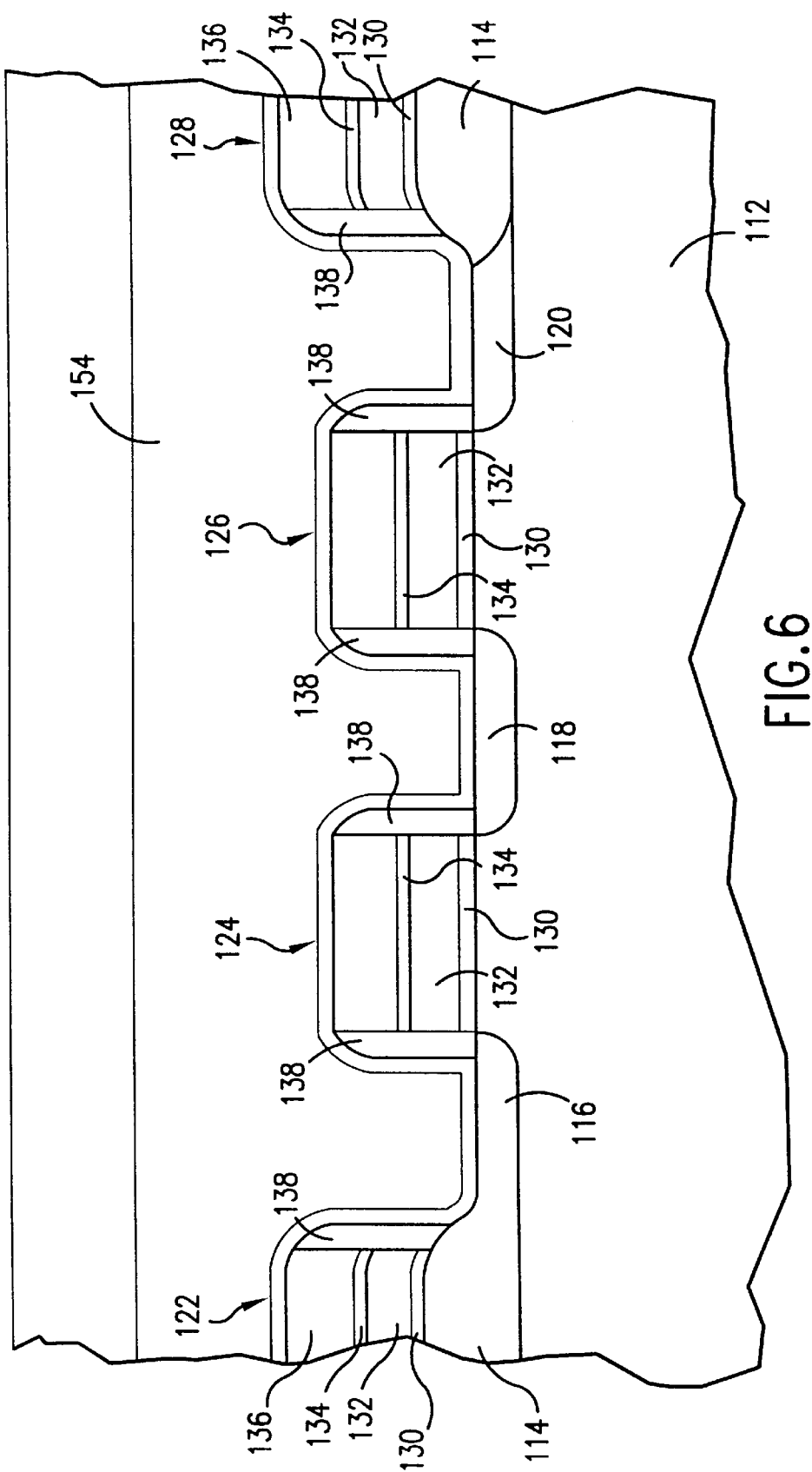
FIG. 6 is a cross-sectional view of a partially completed integrated circuit in which a single IDM layer with target, graded dopant levels has been deposited.

As illustrated in FIG. 6, according to a second aspect of the invention, a single continuous IDM layer 154 containing graded target dopant levels is used in conjunction with a multiple step etching process. According to a preferred embodiment of this aspect of the present invention, the IDM layer 154 is comprised of BPSG with target dopant levels decreasing from heavy to light as the IDM layer 154 is deposited. According to a most preferred embodiment, as initially deposited, the IDM layer 154 is doped with 4% boron, 7% phosphorous and these dopant levels are gradually decreased in a step-wise or, preferably, a continuous manner to 1% boron, 2% phosphorous as the layer is deposited.

Figure 7:
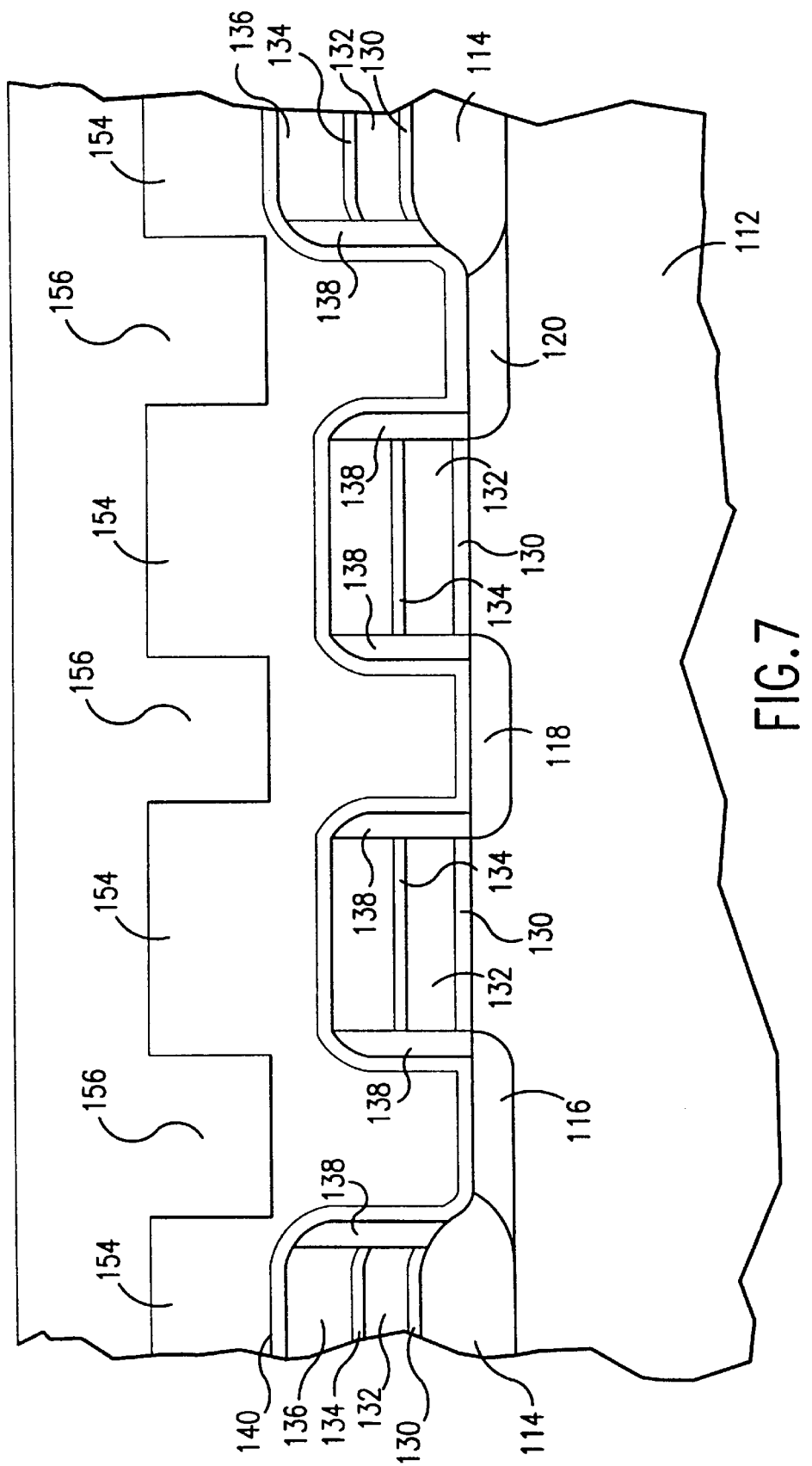
FIG. 7 is a cross-sectional view of a partially completed integrated circuit in which a single IDM layer with target, graded dopant levels has been deposited and has undergone a first etch selective for the lower composition of the IDM layer.
Figure 8:
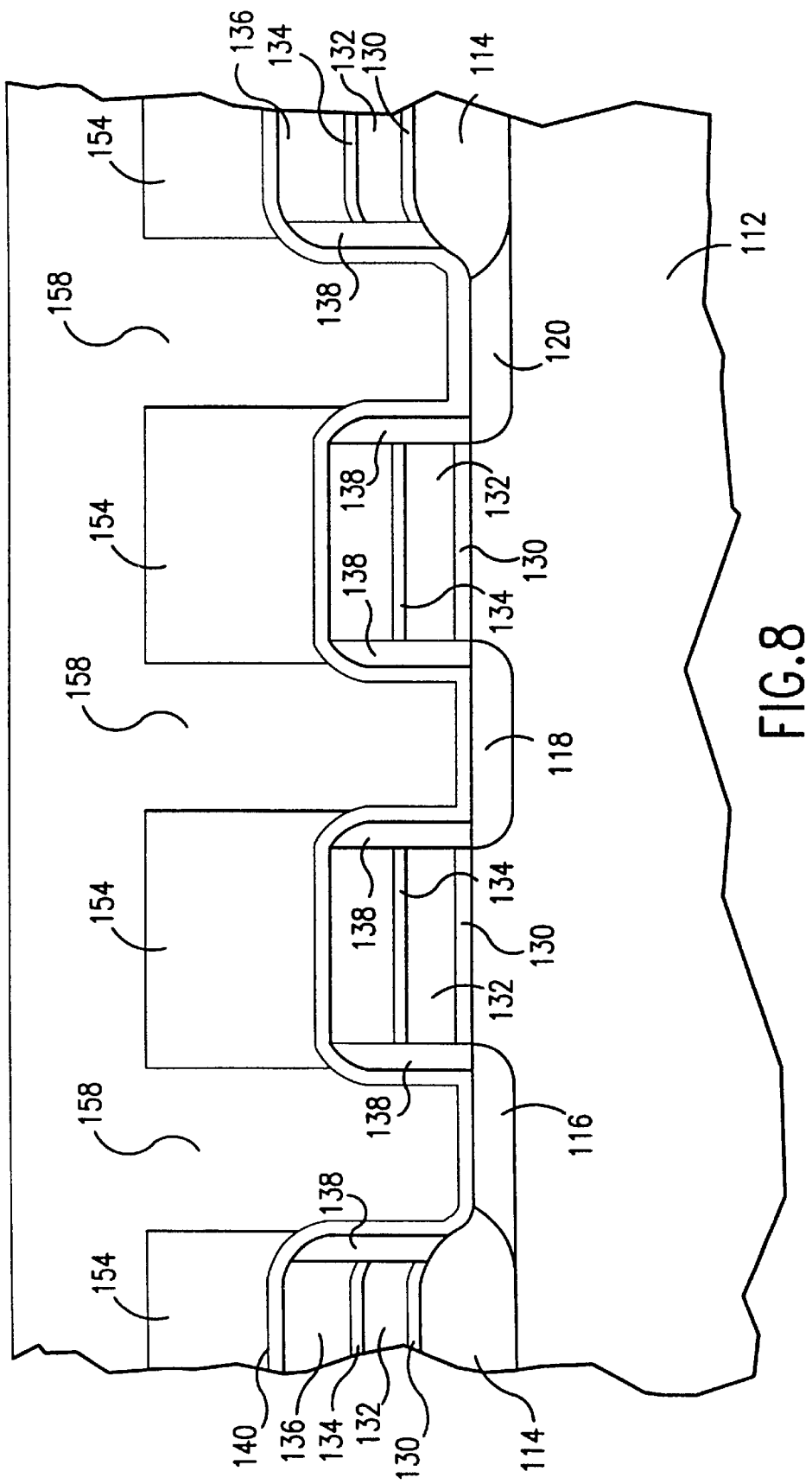
FIG. 8 is a cross-sectional view of a partially completed integrated circuit in which a single IDM layer with target, graded dopant levels has been deposited and has undergone a second etch selective for the upper composition of the IDM layer.

As illustrated in FIGS. 7 and 8, once the graded IDM layer is deposited with target dopant levels, a multiple step etch is applied in which the first etch is selective for the composition of a lower portion of the IDM layers 154 layer such that it keeps a substantially straight vertical profile in an upper portion of the IMD layer 154 and slows down when it reaches the lower portion.

As illustrated in FIG. 7, at the conclusion of the first etching step, the upper portion of the IDM layer 154 is etched through and the initial container openings 156 are formed.

As illustrated in FIG. 8, once the first etching step is completed, a second etch is conducted which has a relatively high selectivity for the composition of the upper portion of the IDM layer 154, a thus a very low isotropic component for the upper portion and also sufficient selectivity to the thin nitride layer 140. At the conclusion of the second etching step, the IDM layer 154 is completely etched through and the completed container openings 158 are formed.

The above-described two-step etch combined with target dopant levels, which provide a graded dopant concentration, could also be carried out with any number of etch steps and different etch processes. The target dopant levels could also be combined or substituted with other etch rate varying characteristics.

The above-described preferred embodiments compensate for the bowing out of the upper layer in order to form substantially straight vertical wall container cells. For other applications and other desired or target etch profiles, bowing out may be desired. By changing the degree of isotropy of a particular etching process and the etch rate characteristics of the etchable material, the horizontal component of the etch can be increased or decreased to fabricate openings of any desired profile. Thus bowing out may be reduced or increased not only at the top but also at the bottom or middle of the etch profile to form, e.g., barrel shaped, cone shaped, stepped, or hour glass shaped etch profiles.

The above descriptions and drawings are only illustrative of preferred embodiments which achieve the objects, features and advantages of the present invention, and it is not intended that the present invention be limited thereto. The principles taught herein can be used to form any target etch profile so long as the etch rate varying characteristics of the etchable material are adjusted to match the particular etching process so as to result in the desired profile.

While the invention has been described with reference to specific embodiments, it will be apparent to those skilled in the art that many alternatives, modifications, and variations may be made. Accordingly, it is intended to embrace all such alternatives, modifications, and variations that may fall within the spirit and scope of the appended claims.

What is claimed as new and desired to be protected by Letters Patent of the United States is:

1. A container cell comprising:

a lower surface of nitride material; and a side surface having an upper portion having a first composition and a lower portion having a second composition, wherein said first and second compositions are distinct from each other with respect to at least one characteristic affecting the etch rate of said upper portion and of said lower portion, wherein said first and second compositions are chosen such that exposure of said first and second compositions to a first and second etchants results in an etch profile having substantially straight vertical sidewalls, and wherein a capacitor is located within said upper portion of said container cell.

2. The container cell of claim 1, wherein said first composition and said second composition differ with respect to target dopant levels.

3. The container cell of claim 2, wherein said first composition is more lightly doped than said second composition.

4. The container cell of claim 3, wherein said first composition is selected from the group consisting of borophosphosilicate glass (BPSG), phosphosilicate glass (PSG), and tetraethyl orthosilicate (TEOS).

5. The container cell of claim 2, wherein said first composition is more heavily doped than said second composition.

6. The container cell of claim 5, wherein said first composition is selected from the group consisting of borophosphosilicate glass (BPSG), phosphosilicate glass (PSG), and tetraethyl orthosilicate (TEOS).

7. The container cell of claim 1, wherein said first composition and said second composition differ with respect to density.

8. The container cell of claim 1, wherein said first composition and said second composition differ with respect to deposition temperature.

9. The container cell of claim 1, wherein said first composition and said second composition differ with respect to deposition pressure.

10. The container cell of claim 1, wherein one of said first and second compositions is high density plasma phosphosilicate glass and is deposited under high temperature, and the other one of said first and second compositions is high density plasma phosphosilicate glass and is deposited using low temperature.

11. A DRAM container capacitor comprising:

a pair of conductive surfaces;

a dielectric provided between said conductive surfaces; and said conductive surfaces being provided with a container cell, said container cell including a lower surface and a side surface, said side surface having an upper portion having a first composition and a lower portion having a second composition, wherein said first and second compositions are distinct from each other with respect to at least one characteristic affecting the etch rate of said upper portion and of said lower portion, wherein said first and second compositions are chosen such that exposure of said first and second compositions to a first and second etchants results in substantially straight vertical sidewalls, and wherein said pair of conductor surfaces and said dielectric are located within said upper portion.

12. The DRAM container capacitor of claim 11, wherein said first and second compositions are distinct from each other with respect to dopant levels.

13. The DRAM container capacitor of claim 12, wherein said first composition is more lightly doped than said second composition.

14. The DRAM container capacitor of claim 12, wherein said first composition is more heavily doped than said second composition.

15. The DRAM container capacitor of claim 11, wherein said first and second compositions are distinct from each other with respect to density.

16. The DRAM container capacitor of claim 11, wherein said first and second compositions are distinct from each other with respect to deposition temperature.

17. The DRAM container capacitor of claim 11, wherein said first and second compositions are distinct from each other with respect to deposition pressure.

* * * * *